US009813046B2

(12) United States Patent
Shekhar et al.

(10) Patent No.: US 9,813,046 B2
(45) Date of Patent: Nov. 7, 2017

(54) EMBEDDED BUFFER CIRCUIT COMPENSATION SCHEME FOR INTEGRATED CIRCUITS

(71) Applicant: Intel Corporation, Santa Clara, CA (US)

(72) Inventors: Sameer Shekhar, Poartland, OR (US); Amit K. Jain, Portland, OR (US); Pooja Nukala, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/087,250

(22) Filed: Mar. 31, 2016

(65) Prior Publication Data

US 2017/0288647 A1    Oct. 5, 2017

(51) Int. Cl.
| | |
|---|---|
| *H03K 3/011* | (2006.01) |
| *H01L 23/00* | (2006.01) |
| *H01L 23/498* | (2006.01) |
| *H05K 1/18* | (2006.01) |
| *H01L 25/065* | (2006.01) |

(52) U.S. Cl.
CPC ........ *H03K 3/011* (2013.01); *H01L 23/49838* (2013.01); *H01L 24/17* (2013.01); *H01L 25/0655* (2013.01); *H05K 1/181* (2013.01); *H01L 2224/16225* (2013.01); *H01L 2924/1304* (2013.01); *H01L 2924/13091* (2013.01); *H01L 2924/1432* (2013.01); *H01L 2924/15311* (2013.01); *H01L 2924/19011* (2013.01); *H01L 2924/19043* (2013.01); *H01L 2924/19101* (2013.01); *H05K 2201/10166* (2013.01); *H05K 2201/10234* (2013.01); *H05K 2201/10318* (2013.01); *H05K 2201/10378* (2013.01)

(58) Field of Classification Search
CPC ... H03K 3/011; H01L 23/49838; H01L 24/17; H01L 25/0655; H05K 1/181
USPC .................................................. 327/564, 565
See application file for complete search history.

(56) References Cited

U.S. PATENT DOCUMENTS

| | | | | |
|---|---|---|---|---|
| 6,417,462 | B1 * | 7/2002 | Dabral | G06F 13/4086 174/260 |
| 2004/0256638 | A1 * | 12/2004 | Perego | G06F 13/1684 257/200 |
| 2010/0194428 | A1 * | 8/2010 | Koo | H03K 19/018521 326/30 |
| 2015/0248924 | A1 * | 9/2015 | Priel | G11C 7/1057 327/564 |

* cited by examiner

*Primary Examiner* — William Hernandez
(74) *Attorney, Agent, or Firm* — Schwegman Lundberg & Woessner, P.A.

(57) ABSTRACT

Some embodiments include apparatus and methods using a package substrate and a die coupled to the package substrate. The package substrate includes conductive contacts, conductive paths coupled to the conductive contacts, and a resistor embedded in the package substrate. The die includes buffer circuits and a calibration module coupled to the buffer circuits and the resistor. The buffer circuits include output nodes coupled to the conductive contacts through the conductive paths. The calibration module is configured to perform a calibration operation to adjust resistances of the buffer circuits based on a value of a voltage at a terminal of the resistor during the calibration operation.

21 Claims, 7 Drawing Sheets

EMBEDDED BUFFER CIRCUIT COMPENSATION SCHEME FOR INTEGRATED CIRCUITS

TECHNICAL FIELD

Embodiments described herein pertain to input/output (I/O) circuitry in integrated circuits. Some embodiments relate to calibration for buffer circuits in I/O circuitry.

BACKGROUND

Many electronic devices or systems, such as computers, tablets, and cellular phones, include an integrated circuit (IC) formed in a silicon die. The IC includes I/O circuitry to exchange (send and receive) signals with other components inside or outside the die. Such I/O circuitry usually includes buffer circuits (e.g., output buffer circuits) to provide signals from the IC to other components. Buffer circuits are normally designed to operate at specific parameters that may include specific target impedance values (e.g., target resistance values). Variations in fabricating process, and operating voltage and temperature may cause the impedance values of some conventional buffer circuits to deviate from their target values. Conventional techniques have been introduced to calibrate such buffer circuits in order to maintain their target impedances. However, some of those conventional techniques may face challenges, such as an increase in platform size, complexity, calibrating time, cost, and other undesirable factors.

DETAILED DESCRIPTION

The techniques described herein include schemes for calibrating the impedance of buffer circuits of an IC (or ICs) of an IC package. The buffer circuits can be included in a single die (e.g., single chip) or in multiple dies (e.g., multiple chips) of an IC package. The described techniques include a calibration module and at least one compensation resistor (either a single compensation resistor or multiple compensation resistors). The calibration module can be included (e.g., embedded) in the die (on-chip or on-die calibration module). The compensation resistor can be located outside the die. For example, the compensation resistor can be located at (e.g., embedded in the core of) a package substrate that carries the die of the package. In an arrangement of the package described herein, the buffer circuits can be parts of different types of I/O interfaces. The calibration module described herein includes a multiplexor circuit to selectively calibrate the buffer circuits of different types of I/O interfaces using the same compensation resistor. Improvements and benefits of the techniques described herein are described below.

Figure 1:
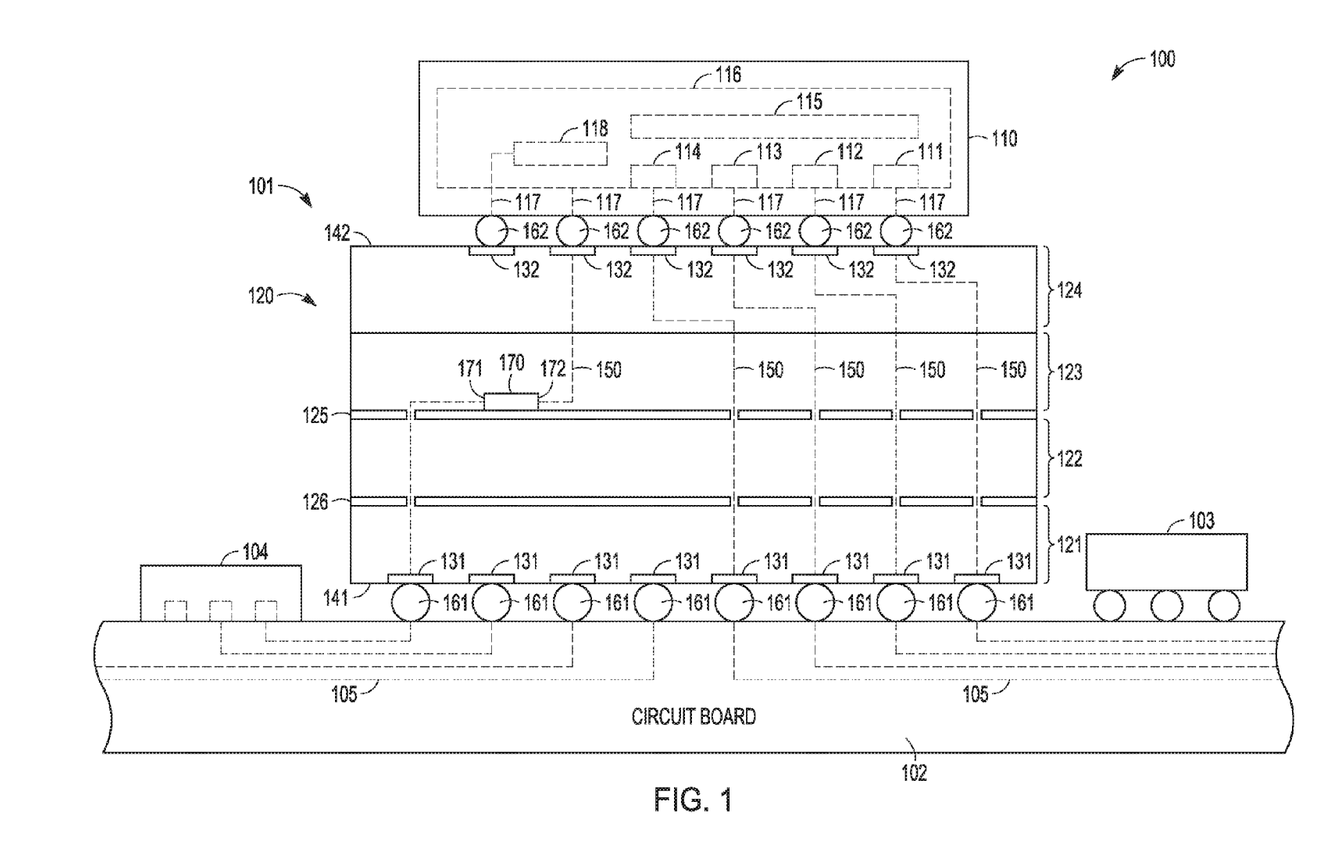
FIG. 1 shows a cross-section of an apparatus including a package coupled to a circuit board, according to some embodiments described herein.

FIG. 1 shows cross-section an apparatus 100 including package 101 coupled to a circuit board 102, according to some embodiments described herein. Package 101 can include an IC package. Circuit board 102 can include a printed circuit board. Apparatus 100 can include or can be included in an electronic device or system. Thus, package 101 and circuit board 102 can be included in an electronic device or system. Examples of such a device or system include communication devices (e.g., mobile (e.g., cellular) phones), network devices (e.g., network adapters (e.g., Ethernet adapters), computers (e.g., servers, desktops, laptops, notebooks, and tablets), and other devices or systems. For simplicity, FIG. 1 shows a side view of only some components of package 101 and circuit board 102. One skilled in the art would readily recognize that an IC package, such as package 101, includes other components, which are omitted from FIG. 1 to help focus on the embodiments described herein.

As shown in FIG. 1, package 101 can include a die 110 attached to (e.g., carried by) a package substrate (e.g., a chip carrier) 120. Package 101 can include or can be included in a ball grid array (BGA) package, a pin grid array (PGA) package, a land grid array (LGA) package, or other types of packages (e.g., multi-core package, and other package structures).

Die 110 can include a semiconductor (e.g., silicon) die (e.g., an IC chip) where components of one or more ICs are formed. The components of die 110 can operate as part of a processor (e.g., a central processing unit (CPU)), a platform controller hub (PCH), a memory device, or any combination thereof). Package 101 can be part of a system in which the system can be included in the same chip (e.g., system on chip (SoC)), in the same package (e.g., system on package (SoP) or system in package (SiP)), or in other types systems.

As shown in FIG. 1, package substrate 120 can include layers 121, 122, 123, and 124. One or more of layers (e.g., 122, 123, or both) among layers 121, 122, 123, and 124 can be part of a core (e.g., package core) of package 101. One or more of layers 121, 122, 123, and 124 can include organic material or inorganic material. In some arrangements, one or more of layers 121, 122, 123, and 124 can include a polymer material or an Ajinomoto buildup film (ABF).

Package substrate 120 can include power delivery formed in one or more of layers 121, 122, 123, and 124. For example, package substrate 120 can include a ground (e.g., Vss) connection 125 and a supply voltage (e.g., Vcc or Vdd) connection 126. Ground connection 125 can be part of a power plane (e.g., ground plane) in one of the layers (e.g., layer 123) of package substrate 120. The supply voltage connection 126 can be part of another power plane (e.g., Vcc or Vdd plane) of another layer (e.g., layer 122) of package substrate 120.

As shown in FIG. 1, package substrate 120 can include conductive contacts (e.g., conductive pads) 131 at a side (e.g., bottom side) 141, and conductive contacts (e.g., conductive pads) 132 at a side (e.g., top side) 142, which is opposite from side 141. Package substrate 120 can include conductive paths (e.g., interconnect paths embedded in package substrate 120) 150 coupled to conductive contacts 131 and 132 to carry signals between conductive contacts 131 and 132.

Package 101 can include connections 161 attached to circuit board 102 to provide electrical connections between conductive paths 150 (through conductive contacts 131) and circuit board 102, and connections 162 attached to 110 to provide electrical connections between conductive paths (through conductive contacts 132) 150 and die 110.

Connections 161 can include conductive elements such as balls (e.g., solder balls), pins (e.g., metal pins), or other types of electrical connections. Connections 162 can include conductive elements such as conductive bumps (e.g., solder bumps), which can include controlled-collapse chip connection (C4) bumps. Connections 162 can include other types of electrical connections.

FIG. 1 shows certain numbers of conductive contacts 131 and 132, conductive paths 150, and connections 161 and 162 as an example. The numbers of these components can vary.

As shown in FIG. 1, die 110 can include buffer circuits 111, 112, 113, and 114 and a functional unit (e.g., a CPU or a microcontroller unit) 115 that are part of an IC (or one of ICs) 116. Buffer circuits 111, 112, 113, and 114 can be coupled to respective conductive paths (inside die 110) 117 and connections 162. Buffer circuits 111, 112, 113, and 114 can operate to provide electrical communication (e.g., provide signals) from components of die 110 to other components outside die 110. For example, buffer circuits 111, 112, 113, and 114 can provide signals from functional unit 115 to components (e.g., components 103 and 104) attached to circuit board 102 through communication paths that include conductive paths 117, connections (e.g., conductive bumps) 162, conductive contacts 132, conductive paths 150, conductive contacts 131, connections (e.g., balls or pins) 161, and conductive paths 105. FIG. 1 shows conductive path 105 (e.g., metal traces) being inside circuit board 102 as an example. Some of conductive paths 105 can be located on the surface of circuit board 102. FIG. 1 shows four buffer circuits 111, 112, 113, and 114 in die 110 as an example. The numbers of buffer circuits of die 110 can vary.

As shown in FIG. 1, die 110 can also include a calibration module 118, which is arranged (e.g., configured) to perform a calibration operation to calibrate buffer circuits 111, 112, 113, and 114. Each of buffer circuits 111, 112, 113, and 114 may be arranged to operate at a target (e.g., predetermined) impedance (e.g., resistance), depending on which type of I/O interface (or interfaces) includes buffer circuits 111, 112, 113, and 114. Variations in fabricating process, voltage, and temperature (PVT) can cause the impendences (e.g., pull-up and pull-down impedances) of the buffer circuits 111, 112, 113, and 114 to change from their respective target impedances (e.g., target resistances). This change may affect the operation of buffer circuits 111, 112, 113, and 114. In order to maintain proper operations of buffer circuits 111, 112, 113, and 114, the calibration operation performed by calibration module 118 can adjust (e.g., tune) the impendences of buffer circuits 111, 112, 113, and 114 to keep the impedances at their respective target impedances.

As shown in FIG. 1, package 101 can include a resistor 170 embedded in (e.g., located in the core of) package substrate 120. Resistor 170 includes a terminal 171 coupled to ground connection 125 and a terminal 172 coupled to calibration module 118. As described in more detail below with reference to FIG. 2 through FIG. 9, resistor 170 can operate with (e.g., can be used by) calibration module 118 during the calibration operation to adjust the impendence of buffer circuits 111, 112, 113, and 114.

FIG. 1 shows resistor 170 being embedded in the core of package substrate 120 as an example. Alternatively, resistor 170 can be located at other locations of package 101. For example, resistor 170 can be placed on circuit board 102 as an on-board resistor. However, placing resistor 170 on circuit board 102 may increase a form factor of apparatus 100 and may increase cost (e.g., bill of material cost), increase learning time to train a user of apparatus 100 to tasks associated with the calibration operation, increase component count (e.g., ball or pin count) of package 101, increase noise from electrical paths coupled between the on-board resistor and calibration module 118, increase filtering cost due to an increase in noise, increase calibration time, lengthen power state transition, and introduce complexity to the platform for apparatus 100.

In FIG. 1, by placing resistor 170 at package substrate 120 (e.g., in the core of package substrate 120) instead of on circuit board 102, any parasitic components (e.g., parasitic inductance and capacitance associated with calibrating buffer circuits 111, 112, 113, and 114) may be reduced (e.g., due to shorter electrical paths between resistor 170 (which is located in package 101) and buffer circuits 111, 112, 113, and 114). The reduction in parasitic components may reduce noise on electrical paths between resistor 170 and buffer circuits 111, 112, 113, and 114. The reduction in noise may lead to a smaller filter circuit (on-die filter) in die 110 used to mitigate noise. Further, by placing resistor 170 at package substrate 120 instead of on a circuit board, electrical paths between resistor 170 and buffer circuits 111, 112, 113, and 114 may be relatively shorter. Shorter electrical paths helps reduce the value of the resistance (e.g., path resistance) of the electrical paths being contributed to the total resistance (e.g., buffer resistance, the resistance of resistor 170, and path resistance) during calibration of buffer circuits 111, 112, 113, and 114. This may further improve the accuracy in the calibration of buffer circuits 111, 112, 113, and 114 (e.g., may allow the adjusted impedance value of the buffer to be closer to the intended value).

The arrangement of calibration module 118 and resistor 170 may also reduce calibration (e.g., tuning) time, form factor, and component count (e.g., ball or pin count) of package 101. This may reduce the size of package 101, increase power state transitions (increasing battery life), reduce complexity of the calibration module 118, and reduce cost associated with calibration of buffer circuits 111, 112, 113, and 114.

Figure 2:
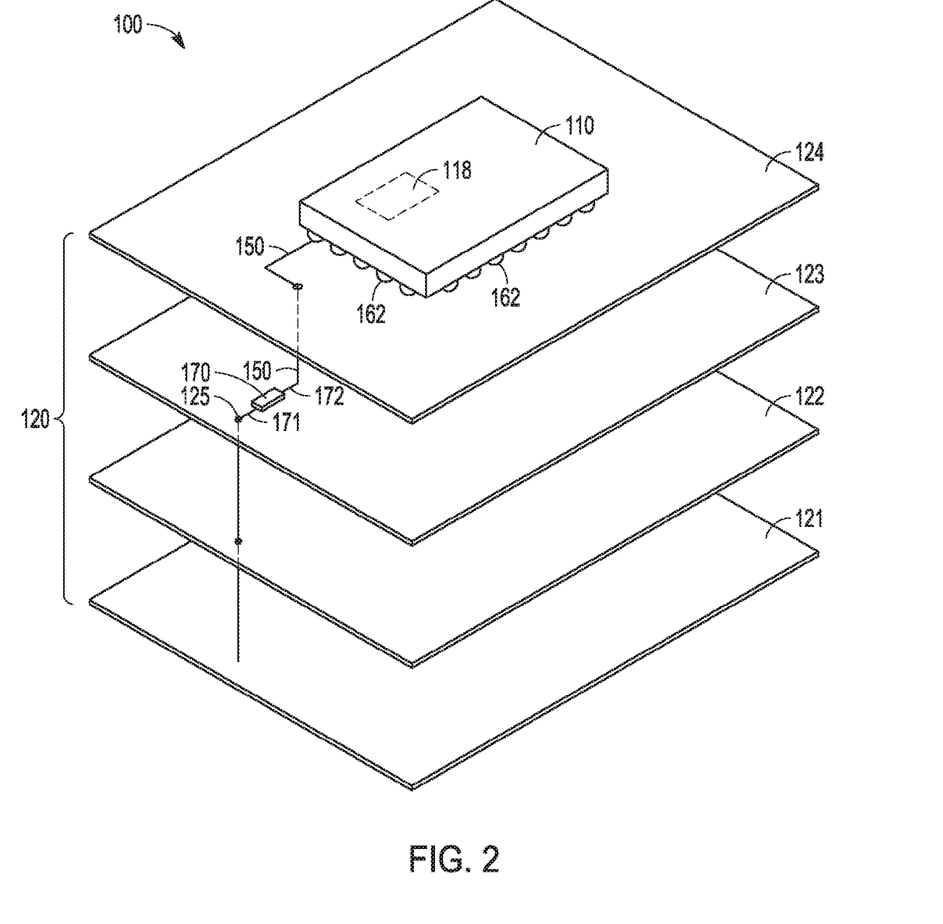
FIG. 2 shows an exploded view of some components of the package of FIG. 1, according to some embodiments described herein.

FIG. 2 shows an exploded view of some components of package 101 of apparatus 100, according to some embodiments described herein. As shown in FIG. 2, die 110 (which includes calibration module 118) can be located over layers 121, 122, 123, and 124 of package substrate 120. Connections (e.g., conductive bumps) 162 can be located between die 110 and package substrate 120 (e.g., underneath die 110 and over layer 124 of package substrate 120).

Resistor 170 can be located in layer 123 (e.g., embedded in the core of) of package substrate 120 in the space (e.g., the space free of signal traces) outside the die shadow (and outside the footprint of die 110) of package 101. Terminal 171 of resistor 170 can be coupled to (e.g., directly coupled to) ground connection 125. Terminal 172 of resistor can be coupled to (e.g., through conductive path 150) to calibration module 118 of die 110.

Figure 3:
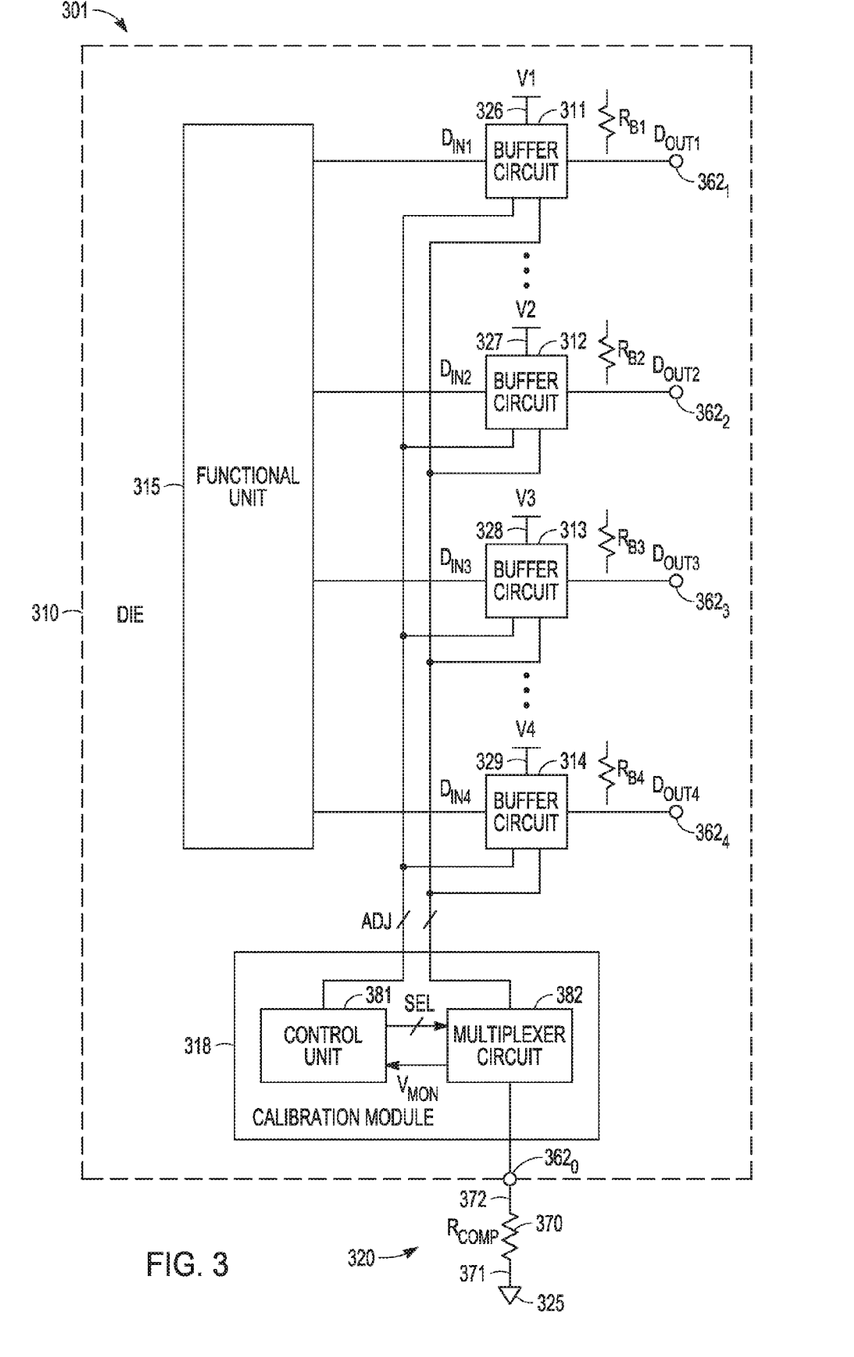
FIG. 3 shows a schematic diagram of a package having a die and a package substrate, according to some embodiments described herein.

FIG. 3 shows a schematic diagram of a package 301 having a die 310 and a package substrate 320, according to some embodiments described herein. Package 301 can correspond to (e.g., have structures and operations similar to) package 101 of FIG. 1, such that package 301 of FIG. 3 can be included in an apparatus (e.g., device or system) such as apparatus 100 of FIG. 1. Die 310 and package substrate 320 can correspond to (e.g., have structures and operations similar to) die 110 and a package substrate 120, respectively of FIG. 1. For simplicity, in FIG. 3, only some of components of die 310 and package substrate 320 are shown.

As shown in FIG. 3, die 310 can include connections $362_0$, $362_1$, $362_2$, $362_3$, and $362_4$; buffer circuits 311, 312, 313, and 314; a functional unit 315; and a calibration module 318. Connections $362_0$, $362_1$, $362_2$, $362_3$, and $362_4$ can correspond to connections (e.g., conductive bumps) 162 of FIG. 1. Package substrate 320 can include a resistor (e.g., compensation resistor) 370, which can correspond to resistor 170 of FIG. 1. Thus, resistor 370 can be located at (e.g., embedded in a core of) package substrate 320. Resistor 370 can include terminals 371 and 372 coupled to ground connection 325 and connection (e.g., conductive bump) $362_0$, respectively. Resistor 370 has a resistance value $R_{COMP}$.

Die 310 may include different types of I/O interfaces to communicate with different components of apparatus 300. Thus, functional unit 315 of die 310 can include components that can operate to communicate (e.g., exchange signals) with different types of I/O interfaces. Buffer circuits 311, 312, 313, and 314 can be included in the same I/O interface (among the different I/O interfaces) of die 310.

Alternatively, buffer circuits 311, 312, 313, and 314 can be included in different types of I/O interfaces of die 310. Examples of different types of I/O interfaces include Peripheral Component Interconnect Express (PCIe) interface, display (video) interface, memory interface (e.g., dynamic random-access memory (DRAM) interface, Universal Serial Bus (USB) interface, High-Definition Multimedia Interface (HDMI) interface, and other types of interfaces. As an example, buffer circuit 311 may be part of one interface (e.g., PCIe interface) of die 310, buffer circuit 312 may be part of another interface (e.g., display interface) of die 310, buffer circuit 313 may be part of yet another interface (e.g., DRAM interface), and buffer circuit 314 may be part of one more other interfaces of die 310. In the example described herein, only one of buffer circuits 311, 312, 313, and 314 is included in an interface of die 310. However, two or more of buffer circuits 311, 312, 313, and 314 can be included in the same interface. For example, buffer circuits 311 and 312 can be included in one interface (e.g., PCIe interface) of die 310, and buffer circuits 313 and 314 can be included in another interface (e.g., memory interface) of die 310.

As shown in FIG. 3, each of buffer circuits 311, 312, 313, and 314 can include an input node to receive a respective signal among signals $D_{IN1}$, $D_{IN2}$, $D_{IN3}$, and $D_{IN4}$ generated by functional unit 315. Functional unit 315 can correspond to functional unit 115 of FIG. 1. In FIG. 3, each of buffer circuits 311, 312, 313, and 314 can include an output node coupled to a respective connection among connections $362_1$, $362_2$, $362_3$, and $362_4$. Buffer circuits 311, 312, 313, and 314 can provide signals $D_{OUT1}$, $D_{OUT2}$, $D_{OUT3}$, and $D_{OUT4}$ at connections $362_1$, $362_2$, $362_3$, and $362_4$, respectively.

Each of signals $D_{OUT1}$, $D_{OUT2}$, $D_{OUT3}$, and $D_{OUT4}$ can be a single-ended signal. Thus, each of connections $362_1$, $362_2$, $362_3$, and $362_4$ can be used to provide single ended signals. In alternative arrangement, some (or all) of signals $D_{OUT1}$, $D_{OUT2}$, $D_{OUT3}$, and $D_{OUT4}$ can be part of differential signals. Thus, in the alternative arrangement, some (or all) of connections $362_1$, $362_2$, $362_3$, and $362_4$ can be used to provide differential signals, such that some (or all) of buffer circuits 311, 312, 313, and 314 can be differential buffers.

Buffer circuits 311, 312, 313, and 314 can be coupled to node (e.g., supply nodes) 326, 327, 328, and 329, respectively, to receive corresponding voltages V1, V2, V3, and V4 (e.g., supply voltage such as Vcc or Vdd). Voltage V1, V2, V3, and V4 can have the same value or different values. For example, if buffer circuits 311, 312, 313, and 314 are part of the same I/O interface, then voltages V1, V2, V3, and V4 can have the same value. In another example, if buffer circuits 311, 312, 313, and 314 are part of different I/O interfaces (e.g., four I/O interfaces), then voltages V1, V2, V3, and V4 can have different values (or the same value if the different I/O interfaces use supply voltages of the same value). In a further example, some of voltages V1, V2, V3, and V4 can have the same value and the rest of voltages V1, V2, V3, and V4 can have different values. Thus, the value of each of voltages V1, V2, V3, and V4 can depend on the type of I/O interface (or I/O interfaces) where buffer circuits 311, 312, 313, and 314 are located.

Each of buffer circuits 311, 312, 313, and 314 can include an impedance between node (e.g., supply voltage connection) 326 and a respective connection $362_1$, $362_2$, $362_3$, and $362_4$. The impedance of each of buffer circuits 311, 312, 313, and 314 can include a resistance, which is presented in FIG. 3 by a respective resistance value $R_{B1}$, $R_{B2}$, $R_{B3}$, or $R_{B4}$.

Buffer circuits 311, 312, 313, and 314 can be adjustable buffer circuits. For example, buffer circuits 311, 312, 313, and 314 can be configured (e.g., structured) to allow calibration module 318 to adjust resistance values $R_{B1}$, $R_{B2}$, $R_{B3}$, or $R_{B4}$. Adjusting the impedances of buffer circuits 311, 312, 313, and 314 includes increasing or decreasing resistance values $R_{B1}$, $R_{B2}$, $R_{B3}$, and $R_{B4}$ until they reach their respective target resistance values (e.g., until they fall within their respective target resistance value ranges)

As shown in FIG. 3, calibration module 318 can include a control unit 381 and a multiplexor circuit 382 that can operate to calibrate buffer circuits 311, 312, 313, and 314. For example, during a calibration operation, control unit 381 can cause (e.g., using select signals SEL) multiplexor circuit 382 to selectively form a circuit path (e.g., form one circuit path at a time) between each of buffer circuits 311, 312, 313, and 314 and resistor 370. Control unit 381 can monitor a voltage $V_{MON}$ at connection $362_0$. Based on the value of the voltage $V_{MON}$, control unit 381 can adjust (e.g., using adjust signals ADJ) the impedances of buffer circuits 311, 312, 313, and 314. For example, control unit 381 can monitor the value of the voltage $V_{MON}$ and adjust resistance values $R_{B1}$, $R_{B2}$, $R_{B3}$, and $R_{B4}$ (e.g., adjust $R_{B1}$, $R_{B2}$, $R_{B3}$, and $R_{B4}$ one at a time) until the value of the voltage $V_{MON}$ reaches an expected voltage value (or expected voltage values) that indicates that resistance values $R_{B1}$, $R_{B2}$, $R_{B3}$, and $R_{B4}$ are deemed to be within their respective target resistance values.

Figure 4:
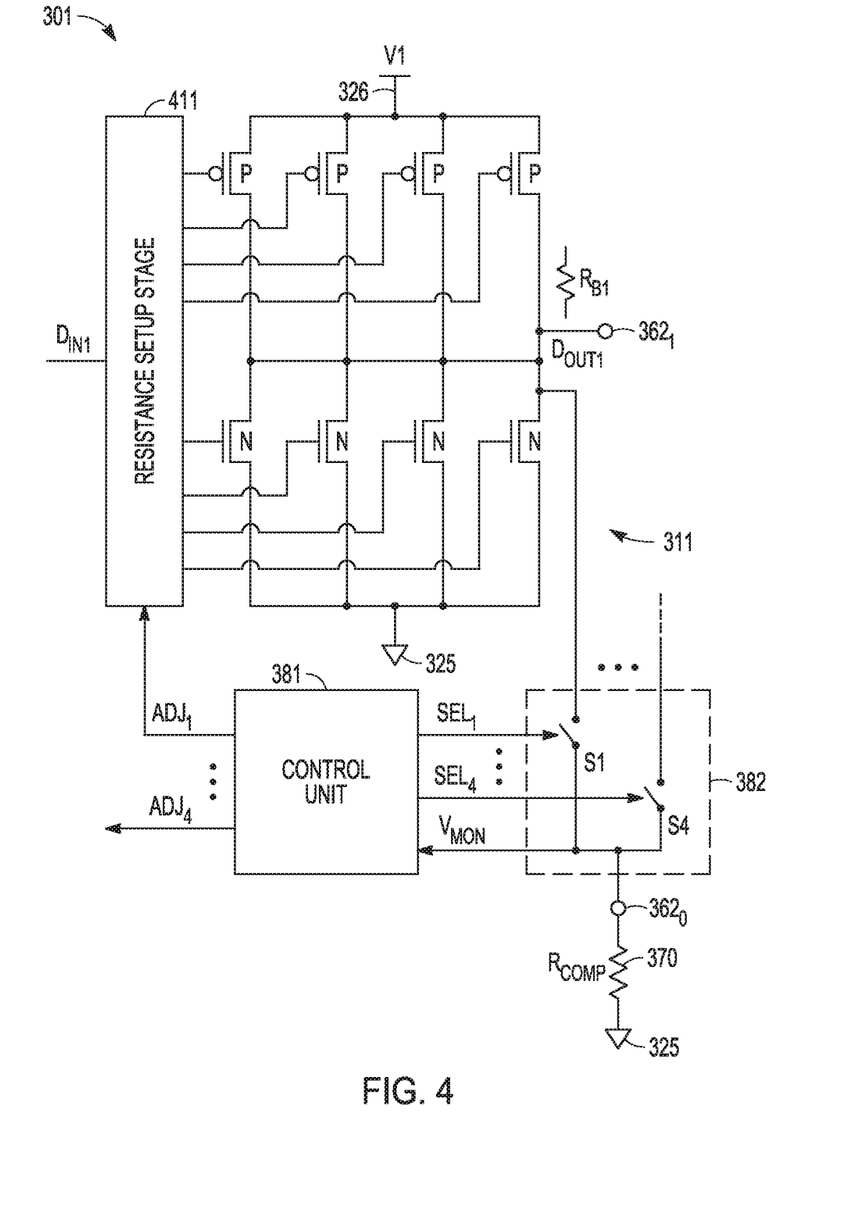
FIG. 4 shows a schematic diagram of one of the buffer circuits and a multiplexor circuit of the package of FIG. 3, according to some embodiments described herein.

FIG. 4 shows a schematic diagram of buffer circuit 311 and multiplexor circuit 382 of package 301 of FIG. 3, according to some embodiments described herein. Other buffer circuits 312, 313, and 314 (FIG. 3) have similar circuit elements as buffer circuit 311. For simplicity, FIG. 4 shows details of only buffer circuit 311.

Buffer circuit 311 can include transistors P and N. Each of transistors P can include a p-channel field effect transistor, such as a p-channel metal-oxide semiconductor (PMOS) transistor. Each of transistors N can include an n-channel field effect transistor, such as an n-channel metal-oxide semiconductor (NMOS) transistor. As shown in FIG. 4, one of transistors P and one of transistors N can be arranged in series between node 326 and ground connection 325 to form a pair of transistors among a number of parallel pairs between node 326 and ground connection 325. Buffer circuit 311 can include a resistance setup stage 411, which can include adjustable (e.g., variable) circuitry to allow the impedance (e.g., resistance) of buffer circuit 311 to be adjusted (e.g., increased or decreased). The structure of buffer circuit 311 shown in FIG. 4 is an example structure. Other structures of buffer circuit 311 may be used as long as the resistance of buffer circuit 311 can be adjusted.

As shown in FIG. 4, the impedance of buffer circuit 311 includes a resistance having resistance value $R_{B1}$ between node 326 and connection $362_1$. Resistance value $R_{B1}$ can be adjusted (e.g., increased or decreased) by selecting an appropriate number of pairs of transistors P and N to be active (e.g., to be enabled to conduct current between node 326 and connection $362_0$) during operation of buffer circuit 311. Resistance value $R_{B1}$ can be inversely proportional to the number of transistors P selected (e.g., enabled) to be active during operation of buffer circuit 311. Thus, in this example, the higher the number of the pairs of transistors P and N enabled to be active, the lower the value of resistance between node 326 and connection $362_1$, and vice versa.

Control unit 381 can operate to send a signal (e.g., adjust signal) $ADJ_1$ (which is one of adjust signals ADJ of FIG. 3) to resistance setup stage 411 of buffer circuit 311 in order to adjust the strength (e.g., resistance value $R_{B1}$) of buffer circuit 311. Adjust signal $ADJ_1$ can carry information that cause to resistance setup stage 411 to increase or decrease resistance value $R_{B1}$ based on the value of the information carried by adjust signal $ADJ_1$. The value of the information carried by adjust signal $ADJ_1$ can be digital information. As an example, if the information carried by adjust signal $ADJ_1$ has one value, then resistance setup stage 411 can adjust resistance value $R_{B1}$ in one direction (e.g., increase resistance value $R_{B1}$). If the information carried by adjust signal $ADJ_1$ has another value, then resistance setup stage 411 can adjust resistance value $R_{B1}$ in another direction (e.g., decrease resistance value $R_{B1}$).

Control unit 381 can monitor voltage $V_{MON}$ at connection $362_0$ during a calibration operation. Based on the value of the voltage $V_{MON}$, control unit 381 can provide adjust signal $ADJ_1$ with appropriate information (e.g., increase resistance or decrease resistance) in order to cause resistance setup stage 411 to adjust resistance value $R_{B1}$ accordingly. The value of voltage $V_{MON}$ can be based on the value of voltage V1 and the series combination of resistance value $R_{B1}$ and resistance value $R_{COMP}$.

As shown in FIG. 4, when switch S1 is turned on (e.g., closed) by select signal $SEL_1$ (which is one of select signals SEL of FIG. 3) from control unit 381 during a calibration operation, the value of voltage $V_{MON}$ can be based on the value of voltage V1, and resistance values $R_{COMP}$ and $R_{B1}$. Based on monitoring the value of voltage $V_{MON}$, resistance value $R_{B1}$ can be adjusted until the value of the voltage $V_{MON}$ indicates that resistance value $R_{B1}$ is deemed to be within the target resistance value range of resistance value $R_{B1}$ (e.g., equal to the target resistance value plus or minus a known acceptable margin value).

For example, if resistance value $R_{B1}$ is targeted to be at a target resistance value $R_{TAR}$ ($R_{B1}$ is targeted to be $R_{TAR}$), then the value of voltage $V_{MON}$ can also be at the value of expected voltage $V_{EXP}$, such that $V_{EXP}=V1-I*R_{TAR}=V1-[(V1/(R_{TAR}+R_{COMP}))*R_{TAR}]$, where $V_{EXP}$ is the expected value of voltage $V_{MON}$ for a particular target resistance value ($R_{TAR}$). During a calibration operation, if the value (e.g., monitored value) of voltage $V_{MON}$ is different from (e.g., not equal to) the value of expected voltage $V_{EXP}$ (which means that resistance value $R_{B1}$ is different from (e.g., not equal to) target resistance value $R_{TAR}$), then resistance value $R_{B1}$ can be adjusted until $V_{MON}=V_{EXP}$ (the value of voltage $V_{MON}$ is equal to the value of expected voltage $V_{EXP}$).

As an example, during a calibration operation, if $V_{MON}>V_{EXP}$ (the value of voltage $V_{MON}$ is greater than the value of expected voltage $V_{EXP}$), then resistance value $R_{B1}$ can be increased. This decreases the value (monitored value) of voltage $V_{MON}$, so that the value of voltage $V_{MON}$ can move toward the value of expected voltage $V_{EXP}$. In this example, if $V_{MON}<V_{EXP}$ (the value of voltage $V_{MON}$ is less than the value of expected voltage $V_{EXP}$), then resistance value $R_{B1}$ can be decreased. This increases the value (monitored value) of voltage $V_{MON}$, so that the value of voltage $V_{MON}$ can move toward the value of expected voltage $V_{EXP}$. During the calibration operation, resistance value $R_{B1}$ may be adjusted one or more times until $V_{MON}=V_{EXP}$ (which indicates that resistance value $R_{B1}$ is equal to resistance value $R_{TAR}$).

As an example, if resistance value $R_{COMP}$ is 50 ohms, the value of voltage V1 is 1V, and resistance value $R_{B1}$ is targeted at 50 ohms (for a particular type of I/O interface), then $V_{EXP}=0.5V$. The calculation of $V_{EXP}$ is based on a voltage divider calculation: $V_{EXP}=I*R_{COMP}=[(V1-0)/(R_{TAR}+R_{COMP})]*R_{COMP}=[1V/(50+50)]*50=0.5V$, where the voltage at ground connection 325 is zero, and I is a current between node 326 and ground connection 325 on a path that includes $R_{B1}$ and $R_{COMP}$.

In another example, if resistance value $R_{COMP}$ is 50 ohms, the value of voltage V1 is 1V, and resistance value $R_{B1}$ is targeted at 75 ohms (for another type of I/O interface), then $V_{EXP}=0.4V$. The calculation of $V_{EXP}$ is based on a voltage divider calculation: $V_{EXP}=I*R_{COMP}=[(V1-0)/(R_{TAR}+R_{COMP})]*R_{COMP}=[1V/(75+50)]*50=0.4V$.

Based on the voltage divider calculation, resistance value $R_{B1}$ can be adjusted to be at any target resistance value by monitoring the value of voltage $V_{MON}$ and adjusting resistance value $R_{B1}$ until $V_{MON}=V_{EXP}$ (e.g., until $V_{MON}=V_{EXP}=0.5V$ or 0.4V in the examples described above).

The above description focuses on adjusting the resistance value $R_{B1}$ of buffer circuit 311. The resistance values (e.g., $R_{B2}$, $R_{B3}$, and $R_{B4}$) of other buffer circuits 312, 313, and 314 (FIG. 3) can also be adjusted in a similar way. For example, to adjust resistance value $R_{B1}$ of buffer circuit 314 (FIG. 3), control unit 381 can activate select signal $SEL_4$ (and deactivate other select signals, e.g., $SEL_1$) to turn on (e.g., close) switch S4 and turn off (e.g., open) other switches (e.g., S1). This allows only buffer circuit 314 (the selected buffer circuit in this example) to be connected to resistor 370, such that a circuit path is formed between connection $362_4$ (FIG. 3) and ground connection 325 through resistor 370. Other buffer circuits 311, 312, and 313 (FIG. 3) are unconnected to resistor 370. Thus, in this example, the value of voltage $V_{MON}$ is based on the resistance value $R_{COMP}$ and resistance value $R_{B4}$. Then, resistance value RB can be adjusted to be within its target resistance value range based on monitoring of the value of voltage $V_{MON}$.

FIG. 4 shows four adjust signals (e.g., $ADJ_1$ through $ADJ_4$) and four select signals (e.g., $SEL_1$ through $SEL_4$) provided by control unit 381 as an example. The number of adjust signals and select signals can vary (e.g., can be based on the number of buffer circuits of die 310).

The above description gives examples for adjusting the impedance of buffer circuits (e.g., buffer circuit 311 of FIG. 4) that include adjusting a resistance of a PMOS transistor of the buffer circuit. However, the techniques described herein can be used to adjust the impedance (e.g., resistance) of other type of transistors (e.g., NMOS transistors).

Figure 5:
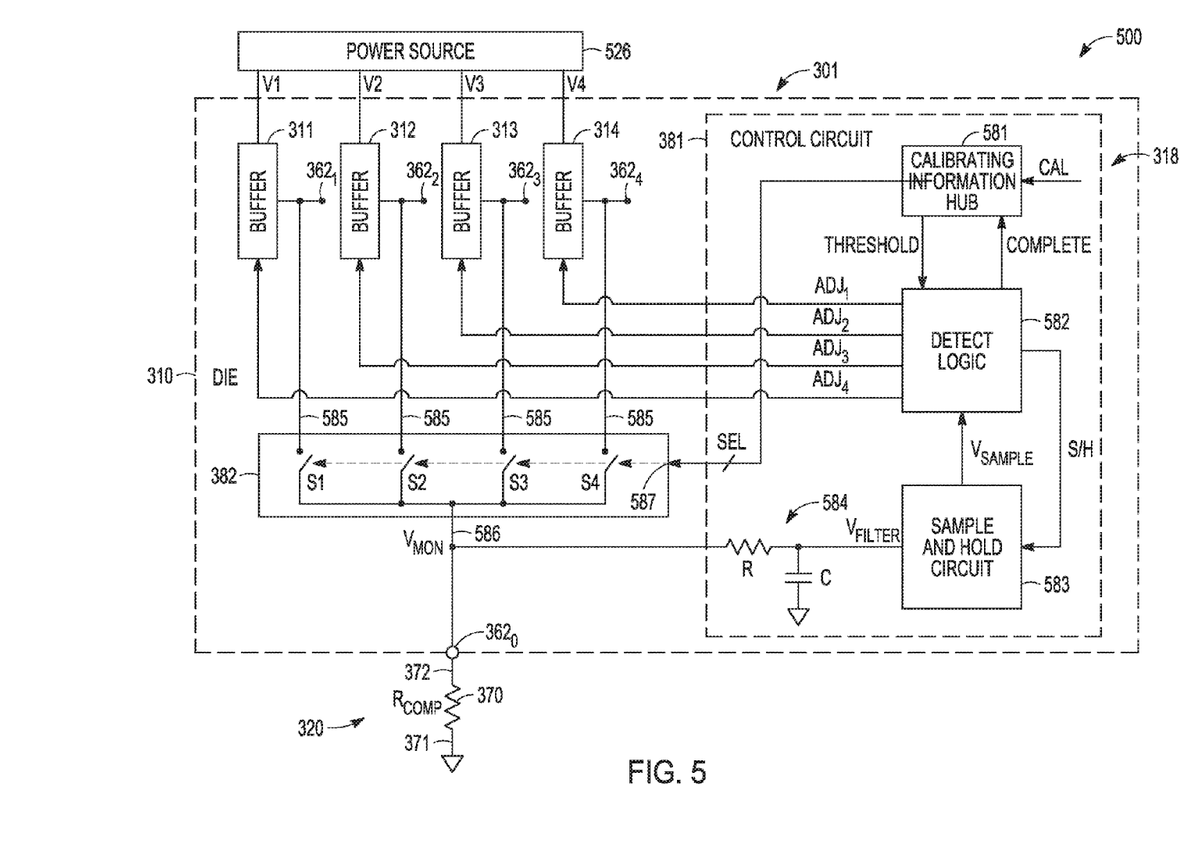
FIG. 5 shows a schematic diagram of an apparatus including the die and the package substrate of FIG. 3 and FIG. 4, according to some embodiments described herein.

FIG. 5 shows a schematic diagram an apparatus 500 including die 310 and package substrate 320 of FIG. 3 and FIG. 4, according to some embodiments described herein. Apparatus 500 can include components similar to, or identical to, the components of apparatus 300 (FIG. 3 and FIG. 4). Similar or identical components (e.g., die 310 and package substrate 320) are given the same labels in FIG. 3 and FIG. 5.

Details of some of the components of FIG. 3 are shown in FIG. 5. For example, as shown in FIG. 5, multiplexor circuit 382 can include nodes (e.g., multiplexor input nodes) 585 respectively coupled to the output nodes of the buffer circuits 311, 312, 313, and 314 (through respective connections $362_1$, $362_2$, $362_3$, $362_4$). Multiplexor circuit 382 can include a node (e.g., a multiplexor output node) 586 coupled to terminal 372 of resistor 370 (through connections $362_0$). Multiplexor circuit 382 can include a control port 587 coupled to the control unit 381 to receive select signals SEL. Control port 587 can include control nodes to provide select signals SEL to control (e.g., turn on or turn off) switches S1, S2, S3, and S4 in order to selectively couple nodes 585 to node 586. This allows control unit 381 to calibrate buffer circuits 311, 312, 313, and 314 using the same resistor (resistor 370) coupled to node 586.

As shown in FIG. 5, apparatus 500 can include a power source 526 to provide voltage V1. Power source 526 can be located on a circuit board of apparatus 300 (e.g., similar to circuit board 102 of FIG. 1). Power source 526 can include a battery, a voltage converter (e.g., alternating current (AC) to direct current (DC) converter), or a combination of both.

Control unit 381 can include a calibrating information hub 581, detect logic 582, a sample and hold circuit 583, and a filter circuit 584. Filter circuit 584 can be an on-die filter circuit (formed on die 310) that can include a resistor (on-die resistor) R and a capacitor (on-die capacitor) C. Calibrating information hub 581 can be configured to store information for calibrating buffer circuits 311, 312, 313, and 314. For example, calibrating information hub 581 can store a table having values corresponding to different values of expected voltage $V_{EXP}$ calculated based on different target resistance values of buffer circuits 311, 312, 313, and 314. Calibrating information hub 581 can also include components (e.g., logic circuitry to control select signals SEL) for allocating time (e.g., providing time-division) to allow buffer circuits 311, 313, 313, and 314 from die 110 (or from multiple dies) of package 301 to share resistor 370 during the calibration operation.

In a calibration operation, calibrating information hub 581 can receive information CAL to initiate the calibration operation. Calibrating information hub 581 can provide information THRESHOLD, which can include information corresponding to the expected value of voltage $V_{MON}$. As described above, expected value of voltage $V_{MON}$ can be based on the target value of the resistance value (e.g., 50 ohms or 60 ohms, or other values) of the buffer circuit being selected to be calibrated (to have its resistance value adjusted).

For example, if $R_{COMP}$=50 ohms, V1=1V, and resistance value $R_{B1}$ of buffer circuit (e.g., selected buffer circuit) is targeted at 50 ohms ($R_{TAR}$=50 ohms), then information THRESOLD can include a value corresponding to $V_{EXP}$=0.5V. In another example, if $R_{COMP}$=50 ohms, V1=1V, and resistance value $R_{B1}$ is targeted at 75 ohms ($R_{TAR}$=75 ohms), then information THRESHOLD can include a value corresponding to $V_{EXP}$=0.4V.

Detect logic 582 and sample and hold circuit 583 can operate to determine whether the value of voltage $V_{MON}$ reaches an expected value (e.g., reaches the value provided by information THRESHOLD). For example, sample and hold circuit 583 can sample the value of voltage $V_{FILTER}$, which is voltage $V_{MON}$ after $V_{MON}$ is filtered by filter circuit 584 to reduce noise. Sample and hold circuit 583 can provide a voltage $V_{SAMPLE}$ based on voltage $V_{FILTER}$. Detect logic 582 can determine whether the value of voltage $V_{SAMPLE}$ (which is based on the value of voltage $V_{MON}$) reaches an expected value provided by information THRESHOLD. Based on the value of voltage $V_{SAMPLE}$, detect logic 582 can provide an adjust signal (one of $ADJ_1$, $ADJ_2$, $ADJ_3$, or $ADJ_4$) to a respective buffer circuit among buffer circuits 311, 312, 313, and 314 that is selected to be calibrated.

Detect logic 582 can also provide a signal S/H (e.g., sample and hold signal) to sample and hold circuit 583 to sample another value of voltage $V_{MON}$ if detect logic 582 determines that the value of voltage $V_{SAMPLE}$ has not reached the value (expected value) provided by information THRESHOLD. The process of sampling the value of voltage $V_{MON}$ (by way of sampling the value of voltage $V_{FILTER}$) and the adjustment of the resistance value of the selected buffer circuit can be repeated by control unit 381 until the value of voltage $V_{MON}$ reaches the expected value. Detect logic 582 can send completion information (e.g., complete signal COMPLETE) to calibrating information hub 581 to indicate that calibration of a particular buffer circuit is completed when the value of voltage $V_{MON}$ reaches the expected value (e.g., $V_{MON}$=$V_{EXP}$). Control unit 381 can select the next buffer circuit (e.g., by activating an appropriate select signal among select signals SEL) and repeat the calibration operation for the next buffer circuit.

Control unit 381 can perform the calibration operation each time apparatus 500 is powered-up (e.g., turned on). Thus, between powered-up events (e.g., system turned-on event), control unit 381 may perform the calibration operation only one time for each of buffer circuits 311, 312, 313, and 314. Alternatively, control unit 381 can perform the calibration operation multiple times between two powered-up events, depending on conditions, such as operating voltage (e.g., V1), the operating temperature, or both, or other conditions (e.g., predetermined conditions stored by calibration information hub 581). As an example, calibrating information hub 518 can store predetermined calibrating voltage information and predetermined calibrating temperature information. Control unit 381 can perform a calibration operation to calibrate buffer circuits 311, 312, 313, and 314 if the operating voltage (e.g., V1) reaches a value indicated by the predetermined calibrating voltage information. Control unit 381 can also perform a calibration operation to calibrate buffer circuits 311, 312, 313, and 314 if the operating temperature reaches a value indicated by the predetermined calibrating temperature information.

As described above, buffer circuits 311, 312, 313, and 314 may be included in different types of I/O interfaces. Thus, buffer circuits 311, 312, 313, and 314 may operate (e.g., may be designed to operate) at different target resistance values. However, with the arrangement of multiplexor circuit 382 and resistor 370 (a single compensation resistor) as shown in FIG. 5, control unit 381 can calibrate all of buffer circuits 311, 312, 313, and 314 without using different compensation resistors for different types of I/O interfaces that include buffer circuits 311, 312, 313, and 314. This may reduce calibration time, reduce complexity (e.g., fewer compensation resistors) for calibration module 318, and save area because of a relatively low number compensation resistors (e.g., one compensation resistor in the example of FIG. 5) used for calibrating buffer circuits 311, 312, 313, and 314.

Figure 6:
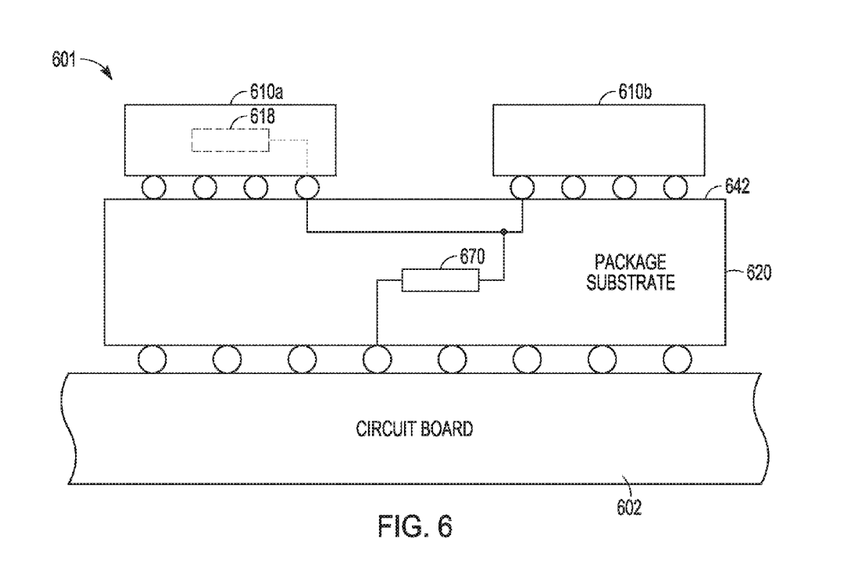
FIG. 6 shows a cross-section of an apparatus including a package having multiple dies that share the same calibration module and the same calibration resistor, according to some embodiments described herein.

FIG. 6 shows a cross-section of an apparatus 600 including a package 601 having multiple dies 610a and 610b sharing the same calibration module 618 and resistor 670, according to some embodiments described herein. Package 601 can be coupled to a circuit board 602. Dies 610a and 610b can be located at the same side (e.g., surface) 642 of a package substrate 620 of package 601. Each of dies 610a and 610b can include one or more ICs (not shown) and buffer circuits (not shown) that can be similar to (or the same as) buffer circuits 111, 112, 113, and 114 (FIG. 1) or buffer circuits 311, 312, 313, and 314 (FIG. 3). Package 601 can include a resistor (e.g., compensation resistor) 670 embedded in package substrate 620. Resistor 670 can be similar to (or the same) resistor 170 (FIG. 1) or resistor 370 (FIG. 3).

Calibration module 618 can include components similar to (or the same as) calibration module 118 (FIG. 1) or calibration module 318 (FIG. 3). Calibration module 618 can perform a calibration operation to calibrate the impedances (e.g., resistances) of the buffer circuits in both dies 610a and 610b using the same resistor 670. The calibration operation of calibration module 618 can be similar to the calibration operations described above with reference to FIG. 1 through FIG. 5. Using calibration module 618 and resistor 670 can provide improvements similar to those described above reference to FIG. 1 through FIG. 5.

Figure 7:
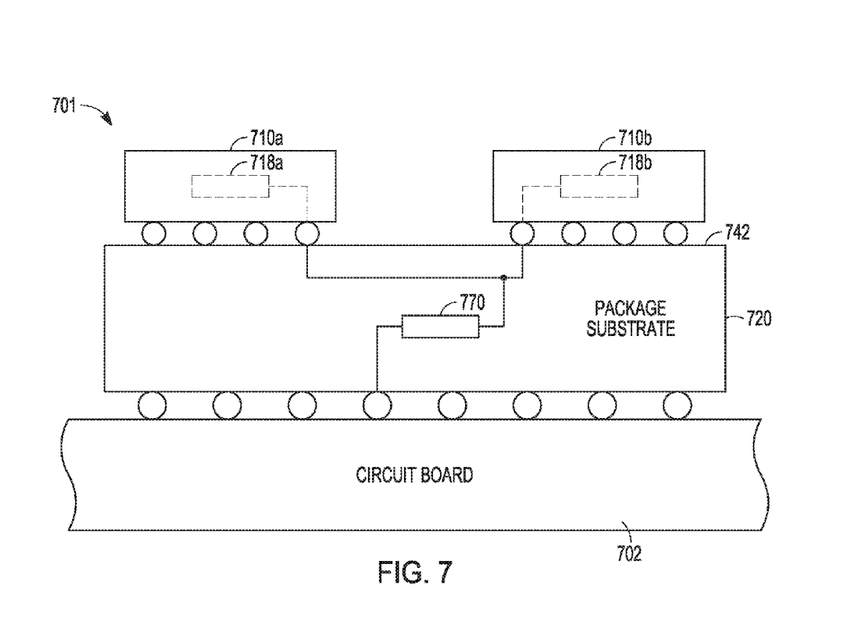
FIG. 7 shows a cross-section of an apparatus including a package having multiple die, separate calibration modules, and a calibration resistor, according to some embodiments described herein.

FIG. 7 shows a cross-section of an apparatus 700 including a package 701 having multiple dies 710a and 760b and separate calibration modules 718a and 718b sharing the same resistor 770, according to some embodiments described herein. Package 701 can be coupled to a circuit board 702. Dies 710a and 710b can be located at the same side (e.g., same surface) 742 of a package substrate 720 of package 701. Each of dies 710a and 710b can include one or more ICs (not shown) and buffer circuits (not shown) that can be similar to (or the same as) buffer circuits 111, 112, 113, and 114 (FIG. 1) or buffer circuits 311, 312, 313, and 314 (FIG. 3). Package 701 can include a resistor (e.g., compensation resistor) 770 embedded in package substrate 720. Resistor 770 can be similar to (or the same) resistor 170 (FIG. 1) or resistor 370 (FIG. 3).

Each of the calibration modules 718a and 718b can include components similar to (or the same as) calibration module 118 (FIG. 1) or calibration module 318 (FIG. 3). Each of calibration modules 718a and 718b can perform a calibration operation to calibrate the impedances (e.g., resistances) of their respective buffer circuits using the same resistor 770. The calibration operation of each of calibration modules 718a and 718b can be similar to the calibration operations described above with reference to FIG. 1 through FIG. 5. Using calibration modules 718a and 718b and resistor 770 can provide improvements similar to those described above reference to FIG. 1 through FIG. 5.

Figure 8:
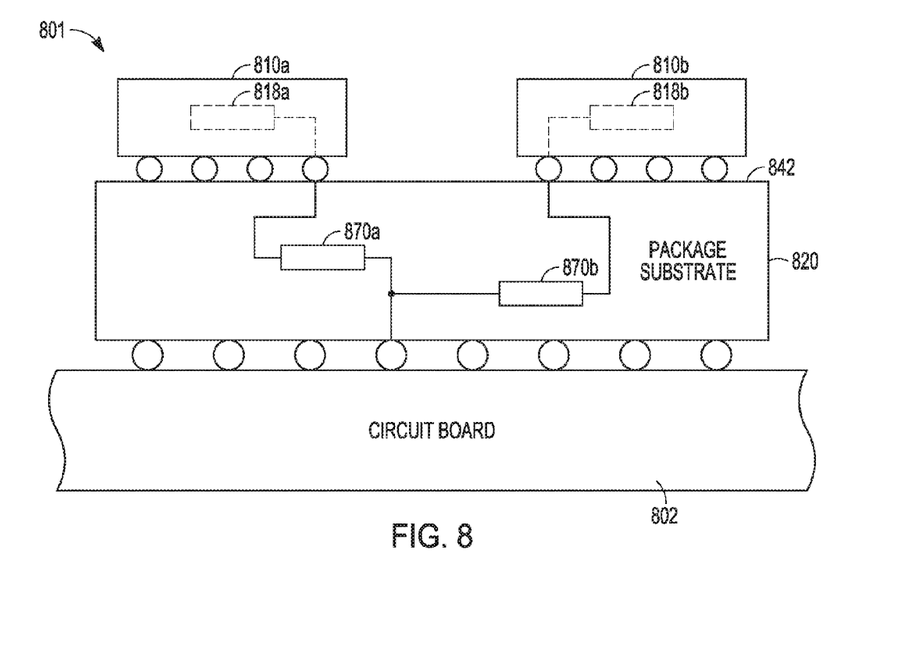
FIG. 8 shows a cross-section of an apparatus including a package having multiple dies, separate calibration modules, and separate calibration resistors, according to some embodiments described herein.

FIG. 8 shows a cross-section of an apparatus 800 including a package 801 having multiple dies 810a and 860b and separate calibration modules 818a and 818b and separate resistors 870a and 870b, according to some embodiments described herein. Package 801 can be coupled to a circuit board 802. Dies 810a and 810b can be located at the same side (e.g., surface) 842 of a package substrate 820 of package 801. Each of dies 810a and 810b can include one or more ICs (not shown) and buffer circuits (not shown) that can be similar to (or the same as) buffer circuits 111, 112, 113, and 114 (FIG. 1) or buffer circuits 311, 312, 313, and 314 (FIG. 3). Package 801 can include resistors (e.g., compensation resistors) 870a and 870b embedded in package substrate 820. Each of resistors 870a and 870b can be similar to (or the same) resistor 170 (FIG. 1) or resistor 370 (FIG. 3).

Each of the calibration modules 818a and 818b can include components similar to (or the same as) calibration module 118 (FIG. 1) or calibration module 318 (FIG. 3). Each of calibration modules 818a and 818b can perform a calibration operation to calibrate the impedances (e.g., resistances) of their respective buffer circuits using their respective resistors 870a and 870b. The calibration operation of each of calibration modules 818a and 818b can be similar to the calibration operations described above with reference to FIG. 1 through FIG. 5. Using calibration modules 818a and 818b and resistors 870a and 878b can provide improvements similar to those described above reference to FIG. 1 through FIG. 5.

Figure 9:
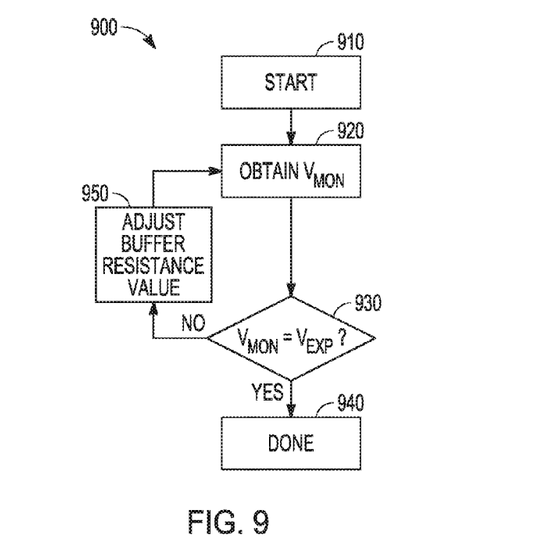
FIG. 9 is a flowchart showing a method of operating a package, according to some embodiments described herein.

FIG. 9 is a flowchart showing a method 900 of operating a package, according to some embodiments described herein. The package used in method 900 can include any of the packages described above with reference to FIG. 1 through FIG. 8. Thus, method 900 can be performed by any of the calibration modules described above with reference to FIG. 1 through FIG. 8. Some of the activities in method 900 may be performed by hardware, software, firmware, or any combination of hardware, software, and firmware. Such hardware, software, and firmware can be included in components (e.g., a calibration module) of a package, such as any of the packages described above with reference to FIG. 1 through FIG. 8.

As shown in FIG. 9, activity 910 of method 900 can include starting (e.g., initiating) a calibration operation at a calibration module, which can be any of the calibration modules described above with reference to FIG. 1 through FIG. 8.

Activity 920 of method 900 can include obtaining the value of voltage $V_{MON}$, which can be voltage $V_{MON}$ at a connection (e.g., solder bump) of the die that includes the calibration module used in method 900.

Activity 930 of method 900 can include determining whether the value of voltage $V_{MON}$ is equal to the value of expected voltage $V_{EXP}$ (whether $V_{MON}=V_{EXP}$). Activity 930 may include operations of calibration module 318 described above with reference to FIG. 5.

In activity 930, if $V_{MON}$ is equal to $V_{EXP}$, then method 900 can continue with activity 940 to complete adjusting the resistance value of the buffer circuit being calibrated.

In activity 930, if $V_{MON}$ is not equal to $V_{EXP}$, then method 900 can continue with activity 950. Activity 950 can include adjusting the resistance value of the buffer circuit being calibrated. After the resistance value of the buffer circuit is adjusted, method 900 may repeat at least one of activities 920 and 930 until $V_{MON}=V_{EXP}$.

Method 900 can include fewer or more activities relative to activities 910, 920, 930, and 940 shown in FIG. 9. For example, method 900 can include activities and operations of any of the calibration modules described above with reference to FIG. 1 through FIG. 8.

The illustrations of the apparatuses (e.g., apparatuses 100, 300, 500, 700, 800, and 900) including packages (e.g., 101, 301, 601, 701, and 801) and methods (e.g., method 900 and operations of calibration modules 118, 318, 618, 718a, 781b, 818a, and 818b) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 3) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including a package substrate including conductive contacts, conductive paths coupled to the conductive contacts, and a resistor embedded in the package substrate, and a die including buffer circuits and a calibration module coupled to the buffer circuits and the resistor, the buffer circuits including output nodes coupled to the conductive contacts through the conductive paths, the calibration module configured to perform a calibration operation to adjust resistances of the buffer circuits based on a value of a voltage at a terminal of the resistor during the calibration operation.

In Example 2, the subject matter of Example 1 may optionally include, wherein the calibration module is configured to increase a resistance of a selected buffer circuit among the buffer circuits if the voltage at the terminal of the resistor has a value greater than an expected voltage value.

In Example 3, the subject matter of Example 1 may optionally include, wherein the calibration module is configured to decrease a resistance of a selected buffer circuit among the buffer circuits if the voltage at the terminal of the resistor has a value less than an expected voltage value.

In Example 4, the subject matter of any of Examples 1-3 may optionally include, wherein the calibration module is configured to adjust a resistance of a selected buffer circuit among the buffer circuits until a first value of the voltage at the terminal of the resistor reaches an expected voltage value.

In Example 5, the subject matter of Example 1 may optionally include, wherein the calibration module is configured to adjust a resistance of an additional selected buffer circuit among the buffer circuits until a second value of the voltage at the terminal of the resistor reaches another expected voltage value.

In Example 6, the subject matter of Example 1 may optionally include, wherein the buffer circuits include a first buffer circuit and a second buffer circuit, and the calibration module is configured to adjust a resistance value of the first buffer circuit based on a first target resistance value, and adjust a resistance value of the second buffer circuit based on a second target resistance value.

In Example 7, the subject matter of any of Examples 1-3 may optionally include, wherein the calibration module is configured to store a table having values corresponding to different expected values of the voltage at the terminal of the resistor during the calibration operation.

In Example 8, the subject matter of any of Examples 1-3 may optionally include, wherein each of the buffer circuits includes a transistor coupled between a supply node and a respective output node among the output nodes of the buffer circuits, and the calibration module is configured to place the transistor in series with the resistor between the supply node and a ground connection during the calibration operation.

In Example 9, the subject matter of any of Examples 1-3 may optionally include, wherein the conductive contacts are arranged to couple to a circuit board through either solder balls or conductive pins.

Example 10 includes subject matter (such as a device, an electronic apparatus (e.g., circuit, electronic system, or both), or a machine) including a package substrate including conductive contacts located at a first side of the package substrate, conductive paths coupled to the conductive contacts, and a resistor embedded in the package substrate, the resistor including a first terminal coupled to a ground connection of the package substrate, and a die located at a second side of the package substrate opposite from the first side, the die including buffer circuits and a multiplexor circuit, the buffer circuits including output nodes coupled to a portion of the conductive contacts through a portion of the conductive paths, the multiplexor circuit including first nodes respectively coupled to respective output nodes of the buffer circuits, and a second node coupled to a second terminal of the resistor.

In Example 11, the subject matter of Example 10 may optionally include, wherein each of the buffer circuits includes a first transistor coupled between a supply node and a respective output node among the output nodes of the buffer circuits, and a second transistor coupled between the respective output node and a second supply node.

In Example 12, the subject matter of Example 10 optionally include, wherein the die includes a conductive bump, and the multiplexor circuit is coupled to the second terminal of the resistor through the conductive bump.

In Example 13, the subject matter of any of Examples 10-12 may optionally include, wherein the buffer circuits include a first buffer circuit and a second buffer circuit, the first buffer circuit arranged to have a first target resistance value, and the second buffer circuit arranged to have a second target resistance value.

In Example 14, the subject matter of any of Examples 10-12 may optionally include, wherein the calibration module includes a filter coupled to the second terminal of the resistor.

In Example 15, the subject matter of any of Examples 10-12 optionally include, an additional die located at the second side of the package substrate and coupled to the second terminal of the resistor.

In Example 16, the subject matter of Example 15 may optionally include, wherein he additional die includes additional buffer circuits and an additional multiplexor circuit, the additional buffer circuits including output nodes coupled to the conductive contacts of the package substrate, the additional multiplexor circuit including first nodes coupled to respective output nodes of the additional buffer circuits, and a second node coupled to the second terminal of the resistor.

In Example 17, the subject matter of Example 15 may optionally include, wherein the package substrate includes an additional resistor embedded in the package substrate, and the additional die includes additional buffer circuits and an additional multiplexor circuit, the additional buffer circuits including output nodes coupled to the conductive contacts of the package substrate, the additional multiplexor circuit including first nodes coupled to respective output nodes of the additional buffer circuits, and a second node coupled to the additional resistor.

In Example 18, the subject matter of Example 15 may optionally include, wherein one of the first and second dies includes a processor.

Example 19 includes subject matter (such as a device, an electronic apparatus (e.g., circuit, electronic system, or both), or a machine) including a circuit board including conductive paths, a package substrate attached to the circuit board and coupled to the conductive paths, the package substrate including conductive contacts, conductive paths coupled to the conductive contacts, and a resistor embedded in the package substrate, and a die coupled to the conductive paths of the package substrate through conductive bumps, the die including buffer circuits and a calibration module coupled to the buffer circuits, the buffer circuits including output nodes coupled to the conductive bumps, the calibration module coupled to the resistor through one of the conductive bumps and configured to perform a calibration operation to adjust resistances of the buffer circuits based on a value of a voltage at a terminal of the resistor during the calibration operation.

In Example 20, the subject matter of Example 19 may optionally include, wherein the buffer circuits are included in a Peripheral Component Interconnect Express (PCIe) interface and a memory interface of the die.

In Example 21, the subject matter of Example 19 may optionally include, wherein the package substrate and the die are part of a system on chip (SoC).

Example 22 includes subject matter (such as a method of operating a device, an electronic apparatus (e.g., circuit, electronic system, or both), or a machine) including initiating a calibration operation at a calibration module of a die, obtaining value of a voltage at a terminal of a resistor embedded in a package substrate coupled to the die, determining whether a value of the voltage reaches an expected value, and adjusting a resistance value of a buffer circuit among buffer circuits of the die based on the determining whether the value of the voltage reaches the expected value.

In Example 23, the subject matter of Example 22 may optionally include, wherein initiating the calibration operation includes coupling an output of the buffer circuit to the resistor through a node of a multiplexor circuit.

In Example 24, the subject matter of Example 23 may optionally include, wherein adjusting a resistance value of an additional buffer circuit among the buffer circuits of the die based on determining whether an additional value of the voltage reaches an additional expected value.

In Example 25, the subject matter of Example 24 may optionally include, wherein coupling an output of the additional buffer circuit to the resistor through the node of the multiplexor circuit during determining whether the additional value of the voltage reaches the additional expected value.

Example 26 includes subject matter (such as a device, an electronic apparatus (e.g., circuit, electronic system, or both), or machine) including means for performing any of the methods of claims 21-25.

The subject matter of Example 1 through Example 26 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    a package substrate including conductive contacts, conductive paths coupled to the conductive contacts, and a resistor embedded in the package substrate, and
    a die including buffer circuits and a calibration module coupled to the buffer circuits and the resistor, the buffer circuits including output nodes coupled to the conductive contacts through the conductive paths, the calibration module configured to perform a calibration operation to adjust resistances of the buffer circuits based on a value of a voltage at a terminal of the resistor during the calibration operation.

2. The apparatus of claim 1, wherein the calibration module is configured to increase a resistance of a selected buffer circuit among the buffer circuits if the voltage at the terminal of the resistor has a value greater than an expected voltage value.

3. The apparatus of claim 1, wherein the calibration module is configured to decrease a resistance of a selected buffer circuit among the buffer circuits if the voltage at the terminal of the resistor has a value less than an expected voltage value.

4. The apparatus of claim 1, wherein the calibration module is configured to adjust a resistance of a selected buffer circuit among the buffer circuits until a first value of the voltage at the terminal of the resistor reaches an expected voltage value.

5. The apparatus of claim 4, wherein the calibration module is configured to adjust a resistance of an additional selected buffer circuit among the buffer circuits until a second value of the voltage at the terminal of the resistor reaches another expected voltage value.

6. The apparatus of claim 1, wherein the buffer circuits include a first buffer circuit and a second buffer circuit, and the calibration module is configured to adjust a resistance value of the first buffer circuit based on a first target resistance value, and adjust a resistance value of the second buffer circuit based on a second target resistance value.

7. The apparatus of claim 1, wherein the calibration module is configured to store a table having values corresponding to different expected values of the voltage at the terminal of the resistor during the calibration operation.

8. The apparatus of claim 1, wherein each of the buffer circuits includes a transistor coupled between a supply node and a respective output node among the output nodes of the buffer circuits, and the calibration module is configured to place the transistor in series with the resistor between the supply node and a ground connection during the calibration operation.

9. The apparatus of claim 1, wherein the conductive contacts are arranged to couple to a circuit board through either solder balls or conductive pins.

10. An apparatus comprising:
a package substrate including conductive contacts located at a first side of the package substrate, conductive paths coupled to the conductive contacts, and a resistor embedded in the package substrate, the resistor including a first terminal coupled to a ground connection of the package substrate; and
a die located at a second side of the package substrate opposite from the first side, the die including buffer circuits and a multiplexor circuit, the buffer circuits including output nodes coupled to a portion of the conductive contacts through a portion of the conductive paths, the multiplexor circuit including first nodes respectively coupled to respective output nodes of the buffer circuits, and a second node coupled to a second terminal of the resistor.

11. The apparatus of claim 10, wherein each of the buffer circuits includes a first transistor coupled between a supply node and a respective output node among the output nodes of the buffer circuits, and a second transistor coupled between the respective output node and a second supply node.

12. The apparatus of claim 10, wherein the die includes a conductive bump, and the multiplexor circuit is coupled to the second terminal of the resistor through the conductive bump.

13. The apparatus of claim 10, wherein the buffer circuits include a first buffer circuit and a second buffer circuit, the first buffer circuit arranged to have a first target resistance value, and the second buffer circuit arranged to have a second target resistance value.

14. The apparatus of claim 10, wherein the die includes a calibration module, and the calibration module includes a filter coupled to the second terminal of the resistor.

15. The apparatus of claim 10, further comprising an additional die located at the second side of the package substrate and coupled to the second terminal of the resistor.

16. The apparatus of claim 15, wherein the additional die includes additional buffer circuits and an additional multiplexor circuit, the additional buffer circuits including output nodes coupled to the conductive contacts of the package substrate, the additional multiplexor circuit including first nodes coupled to respective output nodes of the additional buffer circuits, and a second node coupled to the second terminal of the resistor.

17. The apparatus of claim 15, wherein the package substrate includes an additional resistor embedded in the package substrate, and the additional die includes additional buffer circuits and an additional multiplexor circuit, the additional buffer circuits including output nodes coupled to the conductive contacts of the package substrate, the additional multiplexor circuit including first nodes coupled to respective output nodes of the additional buffer circuits, and a second node coupled to the additional resistor.

18. The apparatus of claim 15, wherein one of the die and the additional die includes a processor.

19. An electronic system comprising:
a circuit board including conductive paths;
a package substrate attached to the circuit board and coupled to the conductive paths, the package substrate including conductive contacts, conductive paths coupled to the conductive contacts, and a resistor embedded in the package substrate; and
a die coupled to the conductive paths of the package substrate through conductive bumps, the die including buffer circuits and a calibration module coupled to the buffer circuits, the buffer circuits including output nodes coupled to the conductive bumps, the calibration module coupled to the resistor through one of the conductive bumps and configured to perform a calibration operation to adjust resistances of the buffer circuits based on a value of a voltage at a terminal of the resistor during the calibration operation.

20. The system of claim 19, wherein the buffer circuits are included in a Peripheral Component Interconnect Express (PCIe) interface and a memory interface of the die.

21. The system of claim 19, wherein the package substrate and the die are part of a system on chip (SoC).

* * * * *